United States Patent
Uchida

(10) Patent No.: US 10,229,973 B2
(45) Date of Patent: Mar. 12, 2019

(54) SEMICONDUCTOR DEVICE INCLUDING SEMICONDUCTOR SUBSTRATE, SILICON CARBIDE SEMICONDUCTOR LAYER, FIRST ELECTRODE AND SECOND ELECTRODE

(71) Applicant: Panasonic Intellectual Property Management Co., Ltd., Osaka (JP)

(72) Inventor: Masao Uchida, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 1 day.

(21) Appl. No.: 15/477,186

(22) Filed: Apr. 3, 2017

(65) Prior Publication Data

US 2017/0317173 A1 Nov. 2, 2017

(30) Foreign Application Priority Data

Apr. 28, 2016 (JP) .................. 2016-090473

(51) Int. Cl.
*H01L 29/15* (2006.01)
*H01L 31/0312* (2006.01)
(Continued)

(52) U.S. Cl.
CPC .... *H01L 29/1608* (2013.01); *H01L 21/02126* (2013.01); *H01L 21/02167* (2013.01);
(Continued)

(58) Field of Classification Search
CPC ......... H01L 21/02126; H01L 21/02167; H01L 21/02378; H01L 21/02447; H01L 29/1608;
(Continued)

(56) References Cited

U.S. PATENT DOCUMENTS 8,106,487 B2 * 1/2012 Soendker ............. H01L 21/045
257/632
2008/0001159 A1 * 1/2008 Ota ..................... H01L 29/0623
257/77

(Continued)

FOREIGN PATENT DOCUMENTS

JP 3-228365 10/1991
JP 2001-053293 2/2001
(Continued)

*Primary Examiner* — Meiya Li
(74) *Attorney, Agent, or Firm* — McDermott Will & Emery LLP

(57) ABSTRACT

A semiconductor device includes a semiconductor substrate of a first conductivity type, having a first principal surface and a second principal surface, a silicon carbide semiconductor layer of the first conductivity type, disposed on the first principal surface, a first electrode disposed on the silicon carbide semiconductor layer, and a second electrode disposed on the second principal surface and forming an ohmic junction with the semiconductor substrate. The semiconductor device satisfies $0.13 \leq Rc/Rd$, where Rc is the contact resistance between the second principal surface and the second electrode at room temperature and Rd is the resistance of the silicon carbide semiconductor layer in a direction normal to the first principal surface at room temperature.

19 Claims, 13 Drawing Sheets

(51) Int. Cl.
  *H01L 29/16* (2006.01)
  *H01L 21/02* (2006.01)
  *H01L 29/66* (2006.01)
  *H01L 29/73* (2006.01)
  *H01L 31/02* (2006.01)
  *H01L 29/872* (2006.01)
  *H01L 29/06* (2006.01)

(52) U.S. Cl.
  CPC .. *H01L 21/02378* (2013.01); *H01L 21/02447* (2013.01); *H01L 29/0615* (2013.01); *H01L 29/0619* (2013.01); *H01L 29/6606* (2013.01); *H01L 29/66113* (2013.01); *H01L 29/7313* (2013.01); *H01L 29/872* (2013.01); *H01L 31/02027* (2013.01)

(58) Field of Classification Search
  CPC ........... H01L 29/66113; H01L 29/7313; H01L 31/02027
  See application file for complete search history.

(56) References Cited

U.S. PATENT DOCUMENTS

| | | | | |
|---|---|---|---|---|
| 2011/0204383 | A1* | 8/2011 | Yamamoto | H01L 21/0495 257/77 |
| 2015/0206941 | A1* | 7/2015 | Uehigashi | H01L 29/872 257/77 |
| 2016/0254393 | A1* | 9/2016 | Ohse | H01L 29/47 257/77 |

FOREIGN PATENT DOCUMENTS

| | | |
|---|---|---|
| JP | 2003-086816 | 3/2003 |
| JP | 2004-528728 | 9/2004 |
| JP | 2014-011285 | 1/2014 |
| WO | 2002/099869 | 12/2002 |

* cited by examiner

SEMICONDUCTOR DEVICE INCLUDING SEMICONDUCTOR SUBSTRATE, SILICON CARBIDE SEMICONDUCTOR LAYER, FIRST ELECTRODE AND SECOND ELECTRODE

BACKGROUND

1. Technical Field

The present disclosure relates to semiconductor devices including silicon carbide.

2. Description of the Related Art

Silicon carbide (SiC) is a semiconductor material having a larger bandgap and a higher hardness than silicon (Si). For example, SiC is used in power devices such as switching devices and rectifying devices. SiC power devices have advantages over Si power devices such as small power dissipation.

Typical SiC semiconductor devices are metal-insulator-semiconductor field-effect transistors (MISFETs) and Schottky-barrier diodes (SBDs). Metal-oxide-semiconductor field-effect transistors (MOSFETs) are a type of MISFETs. Junction-barrier Schottky diodes (JBSs) are a type of SBDs.

A JBS includes a first conductivity type semiconductor layer having a first principal surface and a second principal surface opposite to the first principal surface, a plurality of second conductivity type regions disposed within the first conductivity type semiconductor layer while having a contact with the first principal surface, a Schottky electrode disposed in contact with the first principal surface and forming a Schottky junction with the first conductivity type semiconductor layer, and an ohmic electrode disposed in contact with the second principal surface and forming an ohmic junction with the first conductivity type semiconductor layer. Because of having a plurality of second conductivity type regions, the JBS achieves a reduction in leakage current as compared to an SBD when a voltage is applied between the Schottky electrode and the ohmic electrode to make the Schottky electrode more negative than the ohmic electrode (see, for example, Japanese Unexamined Patent Application Publication (Translation of PCT Application) No. 2004-528728).

SUMMARY

In one general aspect, the techniques disclosed here feature a semiconductor device which includes a semiconductor substrate of a first conductivity type, having a first principal surface and a second principal surface opposite to the first principal surface, a silicon carbide semiconductor layer of the first conductivity type, disposed on the first principal surface of the semiconductor substrate, a first electrode disposed on the silicon carbide semiconductor layer, and a second electrode disposed on the second principal surface of the semiconductor substrate and forming an ohmic junction with the semiconductor substrate. The semiconductor device satisfies $0.13 \leq Rc/Rd$, where Rc is a contact resistance between the second principal surface of the semiconductor substrate and the second electrode at room temperature and Rd is a resistance of the silicon carbide semiconductor layer in a direction normal to the first principal surface at room temperature.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTION

Figure 1:
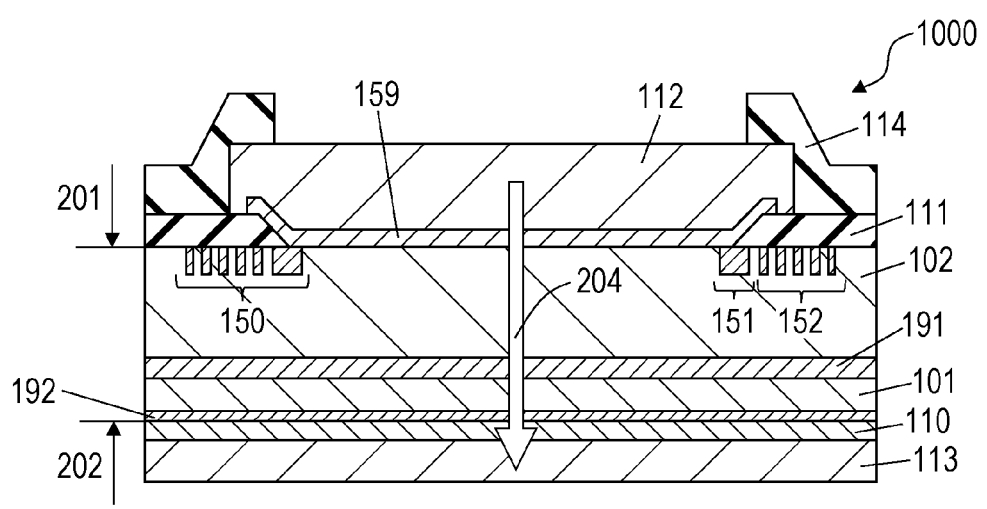
FIG. 1 is a sectional view schematically illustrating an example of semiconductor devices according to a first embodiment.

Underlying knowledge forming the basis of the present disclosure will be described below.

Semiconductor devices including SiC (hereinafter, written as SiC semiconductor devices) are expected to be used at higher temperatures than semiconductor devices including Si. It is therefore demanded that the characteristics of SiC semiconductor devices be stable against temperature change. In particular, SiC semiconductor devices are required to have a small change in on-state resistance depending on temperature.

SiC semiconductor devices such as JBSs and SBDs, when used at high temperatures, can have the following problems. At higher temperatures, JBSs and SBDs exhibit a lower forward rise voltage but increase their on-state resistance. The increase in on-state resistance is mainly ascribed to the increase in the resistance of silicon carbide semiconductor layers in JBSs and SBDs with temperature. Thus, JBSs and SBDs have a risk that their current-voltage characteristics will change significantly depending on temperature, and this fact often makes difficult the system designing of power circuits including JBSs or SBDs.

Regarding the above problem, the present inventor has found that the change in on-state resistance by temperature variation may be reduced by inserting a resistance component that decreases resistance with increasing temperature, in series in the SiC semiconductor device. Specifically, the present inventor has found that the temperature dependence of the on-state resistance of a SiC semiconductor device can be reduced without a significant change in device configuration by causing a silicon carbide semiconductor and an electrode that forms an ohmic junction with the silicon carbide semiconductor to have a higher contact resistance at room temperature than conventional. The semiconductor devices of the present disclosure have been reached based on the above finding.

In the specification, the "on-state resistance" of a semiconductor device indicates the ratio of voltage increase to current increase in the on-state region in current-voltage characteristics of the semiconductor device. This resistance is also written as "differential resistance".

A summary of the present disclosure is described below.

A first aspect of the present disclosure resides in a semiconductor device which includes a semiconductor substrate of a first conductivity type, having a first principal surface and a second principal surface opposite to the first principal surface, a silicon carbide semiconductor layer of the first conductivity type, disposed on the first principal surface of the semiconductor substrate, a first electrode disposed on the silicon carbide semiconductor layer, and a second electrode disposed on the second principal surface of the semiconductor substrate and forming an ohmic junction with the semiconductor substrate. The semiconductor device satisfies $0.13 \leq Rc/Rd$, where $Rc$ is a contact resistance between the second principal surface of the semiconductor substrate and the second electrode at room temperature and $Rd$ is a resistance of the silicon carbide semiconductor layer in a direction normal to the first principal surface at room temperature.

With the above configuration, the ratio of the contact resistance $Rc$ to the resistance $Rd$ of the silicon carbide semiconductor layer at room temperature is high as compared to conventional. Because the contact resistance $Rc$ decreases with increasing temperature, the increase in the resistance $Rd$ of the silicon carbide semiconductor layer by temperature rise is partially compensated for. Thus, the change in the on-state resistance of the semiconductor device by temperature variation can be reduced.

The semiconductor device according to the first aspect of the present disclosure may further includes a termination region of a second conductivity type, disposed within the silicon carbide semiconductor layer. The termination region may enclose a portion of a surface of the silicon carbide semiconductor layer in a plan view. The first electrode may be in direct contact with the silicon carbide semiconductor layer, and an edge portion of the first electrode may be in direct contact with the termination region.

In the semiconductor device according to the first aspect of the present disclosure, the contact resistance may be, for example, not less than $1 \times 10^{-4}$ $\Omega cm^2$. With this configuration, the temperature dependence of the on-state resistance of the semiconductor device may be reduced more effectively.

In the semiconductor device according to the first aspect of the present disclosure, the contact resistance $Rc$ may be, for example, not more than $3 \times 10^{-4}$ $\Omega cm^2$ and the semiconductor device may satisfy $0.15 \leq Rc/Rd$.

The semiconductor device according to the first aspect of the present disclosure may satisfy $Rc/Rd \leq 0.65$.

In the semiconductor device according to the first aspect of the present disclosure, the contact resistance $Rc$ may be not more than $5.5 \times 10^{-4}$ $\Omega cm^2$.

In the semiconductor device according to the first aspect of the present disclosure, the semiconductor device may be a diode, and an avalanche breakdown voltage of the diode at room temperature may be, for example, not less than 600 V and not more than 3000 V. With this configuration, dissipation may be reduced as compared to existing silicon semiconductor devices. Because the semiconductor device is a unipolar device, an increase in the breakdown voltage of the device is realized by decreasing the impurity concentration in the silicon carbide semiconductor layer and increasing the thickness thereof. This approach raises the resistance of the silicon carbide semiconductor layer and hence increases the on-state resistance of the semiconductor device, causing the dissipation to be increased. By configuring the semiconductor device so that the avalanche breakdown voltage does not exceed 3000 V, the dissipation of the semiconductor device may be reduced.

The semiconductor device according to the first aspect of the present disclosure may be such that the termination region includes a guard ring region of the second conductivity type, being in contact with the first electrode, and an electrically floating region of the second conductivity type, being out of contact with the guard ring region and enclosing the guard ring region in a plan view. With this configuration, the breakdown voltage of the semiconductor device may be further increased.

The semiconductor device according to the first aspect of the present disclosure may further include a contact resistance adjustment region disposed within the semiconductor substrate in contact with the second principal surface. With this configuration, the contact resistance between the semiconductor substrate and the second electrode may be controlled by, for example, impurity implantation.

In the semiconductor device according to the first aspect of the present disclosure, the contact resistance adjustment region may be of the first conductivity type. This configuration ensures an ohmic contact between the semiconductor substrate and the second electrode in the semiconductor device. The contact resistance adjustment region may be an implanted region. The second principal surface may be modified by roughening.

In the semiconductor device according to the first aspect of the present disclosure, the second electrode may include titanium (Ti). This configuration facilitates the control of the contact resistance between the second principal surface of the semiconductor substrate and the second electrode.

In the semiconductor device according to the first aspect of the present disclosure, a thickness of the second electrode may be not less than 100 nm and not more than 200 nm.

In the semiconductor device according to the first aspect of the present disclosure, the first electrode may form a Schottky junction with the silicon carbide semiconductor layer.

A second aspect of the present disclosure resides in a semiconductor device which includes a semiconductor substrate of a first conductivity type, having a first principal surface and a second principal surface opposite to the first principal surface, a silicon carbide semiconductor layer of the first conductivity type, disposed on the first principal surface of the semiconductor substrate, a first electrode disposed on the silicon carbide semiconductor layer, and a second electrode disposed on the second principal surface of the semiconductor substrate and forming an ohmic junction with the semiconductor substrate. The semiconductor device may have nonlinear current-voltage characteristics when a voltage is applied between the first electrode and the second electrode to make the first electrode more positive than the second electrode. The semiconductor device may satisfy $1<dRf_{150}/dRf_{25}<1.5$, where $dRf_{25}$ is a ratio of a voltage increase to a current increase at 25° C. and $dRf_{150}$ is a ratio of a voltage increase to a current increase at 150° C. in an on-state region of the current-voltage characteristics. With this configuration, the temperature dependence of the on-state resistance of the semiconductor device may be reduced.

The semiconductor device according to the second aspect of the present disclosure may satisfy $1<dRf_{150}/dRf_{25}\leq1.35$.

In the semiconductor device according to the second aspect of the present disclosure, the semiconductor device may be a diode, and an avalanche breakdown voltage of the diode at room temperature may be not less than 600 V and not more than 3000 V. With this configuration, dissipation may be reduced as compared to existing silicon semiconductor devices.

In the semiconductor device according to the second aspect of the present disclosure, the first electrode may form a Schottky junction with the silicon carbide semiconductor layer.

First Embodiment

Hereinbelow, the first embodiment of the present disclosure will be described with reference to the drawings. While the first embodiment illustrates the first conductivity type as being n-type and the second conductivity type as p-type, the conductivity types in the first embodiment are not limited thereto and the first conductivity type may be p-type and the second conductivity type may be n-type.

(Structure of Semiconductor Devices)

A semiconductor device 1000 according to the first embodiment will be described with reference to FIGS. 1 to 12.

FIG. 1 is a sectional view schematically illustrating the semiconductor device 1000 according to the present embodiment.

The semiconductor device 1000 includes a first conductivity type semiconductor substrate 101, and a first conductivity type drift layer 102 disposed on a first principal surface of the semiconductor substrate 101. A second conductivity type termination region 150 may be disposed within the drift layer 102. The semiconductor device 1000 may further include a first conductivity type buffer layer 191 between the drift layer 102 and the semiconductor substrate 101. The drift layer 102 and the buffer layer 191 correspond to a first conductivity type silicon carbide semiconductor layer.

A first electrode 159 is disposed on a surface 201 of the drift layer 102. The first electrode 159 forms a Schottky junction with the drift layer 102. The first electrode 159 may be in contact with the termination region 150 at an edge portion of the electrode surface in contact with the drift layer 102.

A second electrode 110 is disposed on a second principal surface 202 of the semiconductor substrate 101. The second electrode 110 forms an ohmic junction with the semiconductor substrate 101. A contact resistance adjustment region 192 may be provided within the semiconductor substrate 101 so as to be in contact with the second principal surface 202.

The termination region 150 may include a second conductivity type guard ring region 151 that is in contact with a portion of the first electrode 159, and a field limiting ring (FLR) region 152 that is an electrically floating region of the second conductivity type. The FLR region 152 is disposed out of contact with the guard ring region 151 so as to enclose the guard ring region 151 as viewed in a direction normal to the first principal surface of the semiconductor substrate 101. The configuration of the termination region 150 is not limited to the one illustrated herein as long as the termination region 150 encloses a portion of the surface of the drift layer 102 as viewed in the direction normal to the first principal surface of the semiconductor substrate 101. For example, the termination region 150 may have a junction-termination extension (JTE) structure in which the second conductivity type impurity concentration varies from the center to the outer edge of the semiconductor device 1000.

As illustrated, an insulating film 111 may be disposed on the drift layer 102. The insulating film 111 covers the FLR region 152 and may cover a portion of the guard ring region 151. Further, a surface electrode 112 may be disposed on the first electrode 159. An edge portion of the surface electrode 112 may be located on the insulating film 111. A passivation film 114 may be disposed on a portion of the insulating film 111 and a portion of the surface electrode 112. The passivation film 114 may cover the side surface and a portion of the top surface of the surface electrode 112. A backside electrode 113 may be disposed on the lower surface of the second electrode 110, namely, the surface opposite to the semiconductor substrate 101.

The semiconductor device 1000 of the present embodiment is designed so that, for example, the contact resistance Rc between the semiconductor substrate 101 and the second electrode 110 is higher than the conventional level. Consequently, the contact resistance Rc represents a higher proportion of the on-state resistance of the semiconductor device 1000. Because the contact resistance Rc decreases with increasing temperature, the increase in the resistance Rd of the drift layer 102 by temperature rise can be compensated for. As a result, the change in on-state resistance by temperature variation can be reduced as compared to conventional devices.

(Operations of Semiconductor Device 1000)

When a metal-semiconductor Schottky junction is biased so that the metal is more negative than the semiconductor, a depletion layer extends at the junction interface. Similarly, when a semiconductor pn junction including a p-type region and an n-type region is biased so that the p-type region is more negative than the n-type region, a depletion layer extends at the junction interface. When the field intensity at the junction interface reaches a threshold, an avalanche current flows in the depletion layer and it becomes impossible to further increase the voltage. In the present specification, the voltage which causes the avalanche current to flow is written as the "avalanche breakdown voltage".

Hereinbelow, the operations of the semiconductor device 1000 will be described taking the first conductivity type as n-type and the second conductivity type as p-type. In the semiconductor device 1000, the application of a voltage which makes the first electrode 159 more positive than the second electrode 110 causes a current to flow from the first electrode 159 side to the second electrode 110 side. This direction is indicated with an arrow 204 in FIG. 1, and is defined as the forward direction. The term "forward biasing" means that a voltage is applied between the first electrode 159 and the second electrode 110 so that the first electrode 159 is more positive than the second electrode 110.

First, the operations of a conventional silicon carbide semiconductor device having a Schottky junction will be described. Here, the conventional semiconductor device basically has a similar shape as the semiconductor device 1000 illustrated in FIG. 1 but differs from the semiconductor device 1000 in that the contact resistance Rc between the semiconductor substrate 101 and the second electrode 110 is low. The contact resistance Rc of the conventional semiconductor device at room temperature is below $1 \times 10^{-4}$ $\Omega cm^2$, and is, for example, not more than $5 \times 10^{-5}$ $\Omega cm^2$.

Figure 2:
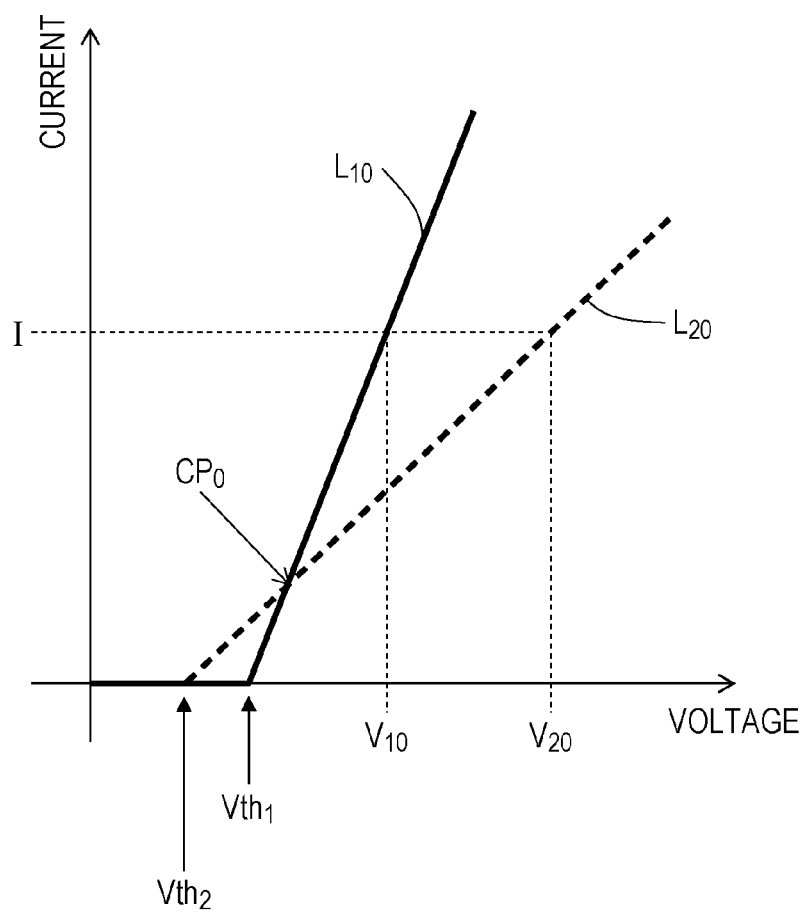
FIG. 2 is a diagram schematically illustrating an example of forward current-voltage characteristics of a conventional semiconductor device.

FIG. 2 is a schematic diagram illustrating forward current-voltage characteristics obtained when a forward voltage is applied to a conventional semiconductor device. In FIG. 2, the characteristic line $L_{10}$ indicates current-voltage characteristics at temperature $T_1$, and the characteristic line $L_{20}$ indicates current-voltage characteristics at temperature $T_2$ higher than the temperature $T_1$. The temperature $T_1$ is, for example, room temperature (here, 25° C.), and the temperature $T_2$ is, for example, 150° C. These temperatures are junction temperatures inside the semiconductor.

When a forward voltage is applied to the conventional semiconductor device at the temperature $T_1$, as indicated by the characteristic line $L_{10}$, little current flows until a certain threshold voltage $Vth_1$. A current flows at and after the threshold voltage. The magnitude of the threshold voltage $Vth_1$ depends on the size of the Schottky barrier formed between the first electrode 159 and the drift layer 102. The magnitude of the threshold voltage $Vth_1$ differs from the magnitude of the Schottky barrier height $\phi b$ that is determined by the Schottky junction. When a forward current flows upon the application of a voltage that is not less than the threshold voltage $Vth_1$, the forward current increases substantially linearly in relation to the increase in forward voltage dVf. The characteristic line $L_{10}$ is substantially linear in the voltage region which allows a current to flow. The value of forward voltage at which this straight line reaches zero forward current is the threshold voltage $Vth_1$. The conventional semiconductor device is in the on-state at the threshold voltage $Vth_1$ and above.

At the temperature $T_2$, similarly, the characteristic line $L_{20}$ is substantially linear in the voltage region in which a current flows. The value of forward voltage at which this straight line reaches zero forward current is the threshold voltage $Vth_2$.

In the voltage region which allows a forward current to flow, the ratio of voltage increase to current increase, dRf, may be represented by the following relation (1) in which dIf is the increase in forward current and dVf is the increase in forward voltage. This ratio dRf is the on-state resistance, namely, the differential resistance described hereinabove.

$$dVf/dIf = dRf \quad (1)$$

The origin of the differential resistance is resistance components in the semiconductor device. Power semiconductor devices including silicon carbide are frequently designed to ensure 600 V or higher avalanche breakdown voltage. The electrode materials are mainly metals. Because the resistance of metals is much lower as compared to semiconductors, the main components of the differential resistance dRf are, as shown in the relation below, the resistance Rd of the drift layer 102, the resistance Rb of the buffer layer 191, the resistance Rsub of the semiconductor substrate 101 and the contact resistance Rc between the semiconductor substrate 101 and the second electrode 110.

$$dRf \approx Rd + Rb + Rsub + Rc$$

In the conventional semiconductor devices, as already mentioned, the contact resistance Rc is lower than $1 \times 10^{-4}$ $\Omega cm^2$ and is treated as zero here (Rc=0). Thus, in the calculation described later, the differential resistance dRf in the conventional semiconductor device may be expressed as Rd+Rb+Rsub.

The comparison of the characteristic lines $L_{10}$ and $L_{20}$ at the temperatures $T_1$ and $T_2$ shows the following.

First, the threshold voltage $Vth_2$ at the temperature $T_2$ is lower than the threshold voltage $Vth_1$ at the temperature $T_1$. This is because the Schottky barrier tends to be smaller with increasing temperature.

Second, the differential resistances at the temperatures $T_1$ and $T_2$, denoted $dRf_{10}$ and $dRf_{20}$ respectively, are such that $dRf_{20}$ is higher than $dRf_{10}$. In the range of temperatures at which silicon carbide semiconductor devices are used (for example, −50° C. to 200° C.), the resistance Rd of the drift layer 102 increases with increasing temperature. This increase in resistance is very influential in the conventional semiconductor devices and consequently the differential resistance $dRf_{20}$ at the temperature $T_2$ is higher than the differential resistance $dRf_{10}$ at the temperature $T_1$.

Because the threshold voltage Vth and the differential resistance dRf vary depending on temperature, as illustrated in FIG. 2, two characteristic lines at different temperatures intersect with each other at a point. In the present specification, the point at which a characteristic line $L_{10}$ at 25° C. as the temperature $T_1$ intersects with a characteristic line $L_{20}$ at 150° C. as the temperature $T_2$ is defined as the cross point $CP_0$. In a conventional semiconductor device designed so that the avalanche breakdown voltage at room temperature is 600 V or above, the forward voltage and the forward current at the cross point $CP_0$ are, for example, 1.1 V to 1.2 V and 3 A to 4 A, respectively.

Similar tendencies are observed also when the temperatures $T_1$ and $T_2$ are different from 25° C. and 150° C., respectively. That is, characteristic lines which show current-voltage characteristics of a conventional Schottky junction semiconductor device at two service temperatures intersect with each other at a point. The intersection is frequently located near the cross point $CP_0$.

In the conventional semiconductor devices, the differential resistances $dRf_{10}$ and $dRf_{20}$ at temperatures $T_1$ and $T_2$ are represented by the following relations (2) and (3) in which $V_{10}$ is the forward voltage which causes the on-state forward current to flow at a certain value I at the temperature $T_1$ and $V_{20}$ is the forward voltage which causes the on-state forward current to flow at the certain value I at the temperature $T_2$.

$$dRf_{10} = dVf/dIf \quad (2)$$
$$= (V_{10} - Vth_1)/I$$

$$dRf_{20} = dVf/dIf \quad (3)$$
$$= (V_{20} - Vth_2)/I$$

Next, the operations of the semiconductor device 1000 of the present embodiment will be described.

Figure 3:
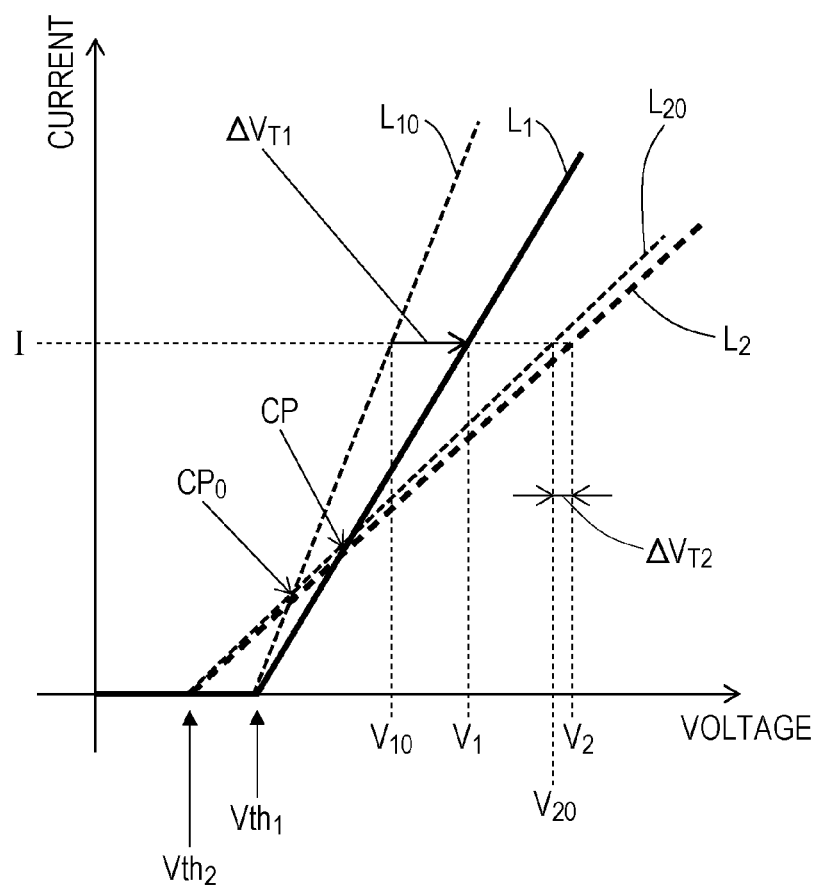
FIG. 3 is a diagram schematically illustrating an example of forward current-voltage characteristics of a semiconductor device according to the first embodiment.

FIG. 3 is a schematic diagram illustrating forward current-voltage characteristics obtained when a forward voltage is applied to the semiconductor device 1000. In FIG. 3, the characteristic line $L_1$ indicates current-voltage characteristics at temperature $T_1$, and the characteristic line $L_2$ indicates current-voltage characteristics at temperature $T_2$ higher than the temperature $T_1$. The temperature $T_1$ is, for example, room temperature (here, 25° C.), and the temperature $T_2$ is, for example, 150° C. For comparison, the characteristic lines $L_{10}$ and $L_{20}$ of the conventional semiconductor device discussed above with reference to FIG. 2 are shown by dotted lines.

In the semiconductor device 1000, the contact resistance Rc between the semiconductor substrate 101 and the second electrode 110 is higher than in the conventional semiconductor device. The contact resistance Rc in the semiconductor device 1000 is, for example, $1 \times 10^{-4}$ $\Omega\text{cm}^2$ or above at room temperature.

In FIG. 3 referring to the semiconductor device 1000, $V_1$ is the forward voltage which causes the on-state forward current to flow at a certain value I at the temperature $T_1$ and $V_2$ is the forward voltage which causes the on-state forward current to flow at the certain value I at the temperature $T_2$. Similarly, in the conventional semiconductor device, $V_{10}$ is the forward voltage which causes the on-state forward current to flow at the certain value I at the temperature $T_1$ and $V_{20}$ is the forward voltage which causes the on-state forward current to flow at the certain value I at the temperature $T_2$.

At the temperature $T_1$, the characteristic line $L_1$ of the semiconductor device 1000 shows the same threshold voltage $Vth_1$ as the characteristic line $L_{10}$ of the conventional semiconductor device, but has a different slope in the voltage region in which a current flows. The characteristic line $L_1$ of the semiconductor device 1000 shows that the application of a voltage to attain a forward current I results in a voltage drop by $\Delta V_{T1}$, namely, $I \times Rc$ (V) as compared to the characteristic line $L_{10}$ of the conventional semiconductor device, as shown by the relation (4) below. That is, the differential resistance dRf of the semiconductor device 1000 is higher than conventional by Rc.

$$\Delta V_{T1} = V_1 - V_{10} = I \times Rc(V) \quad (4)$$

At the temperature $T_2$ (for example, 150° C.), the characteristic line $L_2$ of the semiconductor device 1000 does not differ significantly from the characteristic line $L_{20}$ of the conventional semiconductor device. The characteristic lines $L_2$ and $L_{20}$ have substantially the same threshold voltage and substantially the same slope in the voltage region in which a current flows. The characteristic line $L_2$ of the semiconductor device 1000 at the temperature $T_2$ shows that the application of a voltage to attain a forward current I results in a voltage drop by $\Delta V_{T2}$ as compared to the characteristic line $L_{20}$ of the conventional semiconductor device. That is, similarly to at the temperature $T_1$, the differential resistance dRf of the semiconductor device 1000 at the temperature $T_2$ is higher than that of the conventional semiconductor device by the contact resistance Rc. However, because the contact resistance Rc at the temperature $T_2$ is lower than the contact resistance Rc at the temperature $T_1$, the difference is small between the differential resistance dRf of the semiconductor device 1000 and the differential resistance of the conventional semiconductor device at the temperature $T_2$. As a result, the characteristic lines $L_1$ and $L_2$ of the semiconductor device 1000 intersect with each other at a cross point CP which, as illustrated in FIG. 3, shifts toward the higher voltage side and the higher current side as compared to the cross point $CP_0$ of the conventional semiconductor device.

The differential resistances $dRf_1$ and $dRf_2$ of the semiconductor device 1000 at temperatures $T_1$ and $T_2$, respectively, may be represented by the following relations (5) and (6). Because the contact resistance Rc at high temperature is small, the relation (6) assumes that the voltage drop at the temperature $T_2$ is zero, namely, $V_{20} \approx V_2$.

$$dRf_1 = dVf/dIf \quad (5)$$
$$= (V_1 - Vth_1)/I$$

$$dRf_2 = dVf/dIf \quad (6)$$
$$= (V_2 - Vth_2)/I$$
$$\approx (V_{20} - Vth_2)/I$$
$$= dRf_{20}$$

Here, the differential resistances of the conventional semiconductor device and the semiconductor device 1000 at the temperature $T_2$ are normalized with the differential resistances at the temperature $T_1$ (room temperature). In the specification, the normalized values, $D_0$ and D respectively, are written as the "differential resistance ratios". The differential resistance ratios $D_0$ and D are expressed by the relations (7) and (8) below:

$$D_0 = dRf_{20}/dRf_{10} \quad (7)$$

$$D = dRf_2/dRf_1 \quad (8)$$

From the relations (8), (5), (6), (4), (2) and (7), the differential resistance ratio D of the semiconductor device 1000 may be expressed by the relation (9) using the differential resistance ratio $D_0$ of the conventional semiconductor device.

$$D = dRf_2/dRf_1 \quad (9)$$
$$\approx dRf_{20}/\{(V_1 - Vth_1)/I\}$$
$$= dRf_{20}/\{(V_{10} + IRc - Vth_1)/I\}$$
$$= dRf_{20}/\{(V_{10} - Vth_1)/I + Rc\}$$
$$= dRf_{20}/(dRf_{10} + Rc)$$
$$= D_0 \cdot dRf_{10}/(dRf_{10} + Rc)$$

From the relation (9), $D/D_0$ is calculated as shown in the relation (10):

$$D/D_0 \approx 1/(1 + Rc/dRf_{10}) \quad (10)$$

In the semiconductor device 1000, the amount of the change in differential resistance between the temperature $T_1$ and the temperature $T_2$ may be rendered smaller than that in the conventional semiconductor device by ensuring that $D/D_0$ in the relation (10) is less than 1. (However, $D \geq 1$ and $D_0 > 1$.) That is:

$$1/(1 + Rc/dRf_{10}) < 1 \quad (11)$$

As shown by the relation (12), the differential resistance ratio D of the semiconductor device 1000 may be smaller by 10% or more than the differential resistance ratio $D_0$ of the conventional semiconductor device.

$$1/(1 + Rc/dRf_{10}) \leq 0.9 \quad (12)$$

From the relation (12), the range of contact resistance Rc is represented by, for example, the relation (13):

$$Rc \geq (dRf_{10})/9 \quad (13)$$

As mentioned earlier, the differential resistance $dRf_{10}$ of the conventional semiconductor device is represented by the following relation (14):

$$dRf_{10} = Rd + Rb + Rsub + Rc \quad (14)$$
$$\approx Rd + Rb + Rsub$$

From the relations (13) and (14), the following relation (15) is obtained:

$$Rc/(Rd+Rsub+Rb) \geq 0.11 \quad (15)$$

From the relation (15), a relationship between the contact resistance Rc and the contact resistance to drift resistance ratio Rc/Rd may be calculated.

Here, assuming that Rd denotes the drift resistance when the semiconductor device 1000 has an avalanche breakdown voltage (BVd) of 600 V to 3000 V, a relationship between the contact resistance Rc and the drift resistance Rd was calculated.

In the calculation, the drift layer 102 was a silicon carbide 4H—SiC epitaxial layer. The drift resistance Rd with which a prescribed breakdown voltage of 600 V to 3000 V was obtained was determined while changing the concentration and thickness of the drift layer 102. The resistances Rb and Rsub of the buffer layer 191 and the semiconductor substrate 101 were constant. Here, the buffer layer 191 was a 4H—SiC epitaxial layer having a concentration of $1 \times 10^{18}$ cm$^{-3}$ and a thickness of 0.5 µm. The semiconductor substrate 101 was a 4H—SiC (0001) substrate having a resistivity of 0.02 Ωcm and a thickness of 350 µm. The avalanche breakdown voltage was assumed to be determined at the pn junction of the termination region 150 disposed in the semiconductor device 1000, and the depth of the pn junction was 1 µm as measured from the surface 201 of the drift layer 102.

Figure 4:
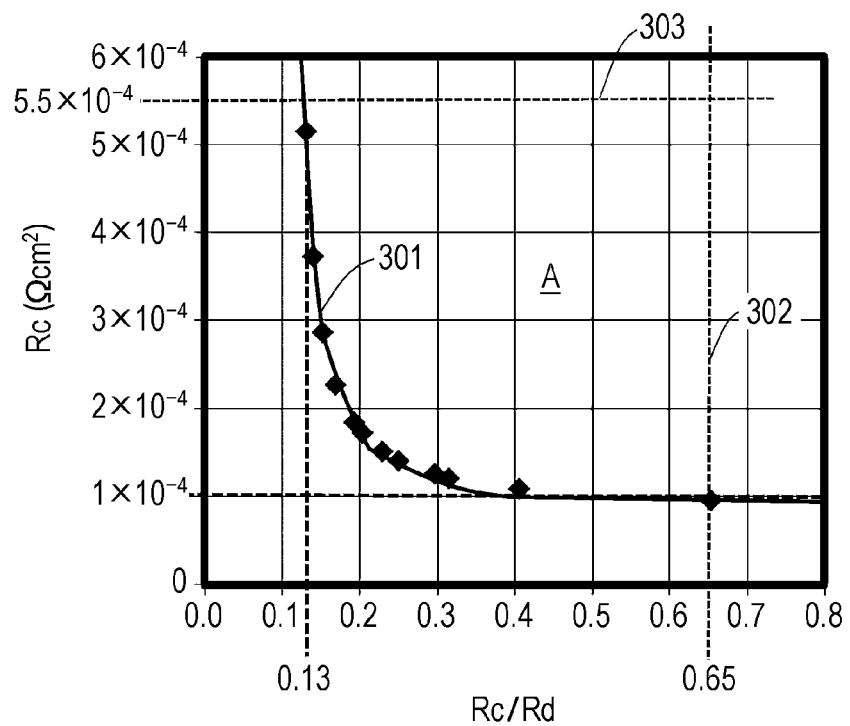
FIG. 4 is a diagram illustrating a relationship between the contact resistance Rc and the contact resistance to drift resistance ratio Rc/Rd of semiconductor devices according to the first embodiment.

The calculation results are described in FIG. 4. In FIG. 4, the abscissa is the contact resistance to drift resistance ratio Rc/Rd, and the ordinate is the contact resistance Rc. The line 301 in FIG. 4 is a graph corresponding to the relation (15), and the region A on and in the upper right of the line 301 satisfies the relation (15). As shown by the results, the ratio of the contact resistance Rc to the drift resistance Rd, namely, Rc/Rd, may be, for example, 0.13 or above, and the contact resistance Rc may be, for example, $1 \times 10^{-4}$ Ωcm$^2$ or above. In order to design the semiconductor device 1000 with an avalanche breakdown voltage of 600 V to 3000 V, Rc/Rd may be 0.65 or less, and the contact resistance Rc may be $5.5 \times 10^{-4}$ Ωcm$^2$ or less. Thus, the contact resistance Rc and the drift resistance Rd may be set, for example, to fall in the region A enclosed by the line 301, the line 302 and the line 303.

The contact resistance Rc may be $3 \times 10^{-4}$ Ωcm$^2$ or less. In the graph illustrated in FIG. 4, the contact resistance to drift resistance ratio Rc/Rd at a contact resistance Rc of $3 \times 10^{-4}$ Ωcm$^2$ is 0.15. Thus, the contact resistance to drift resistance ratio Rc/Rd may be 0.15 or above.

Figure 5:
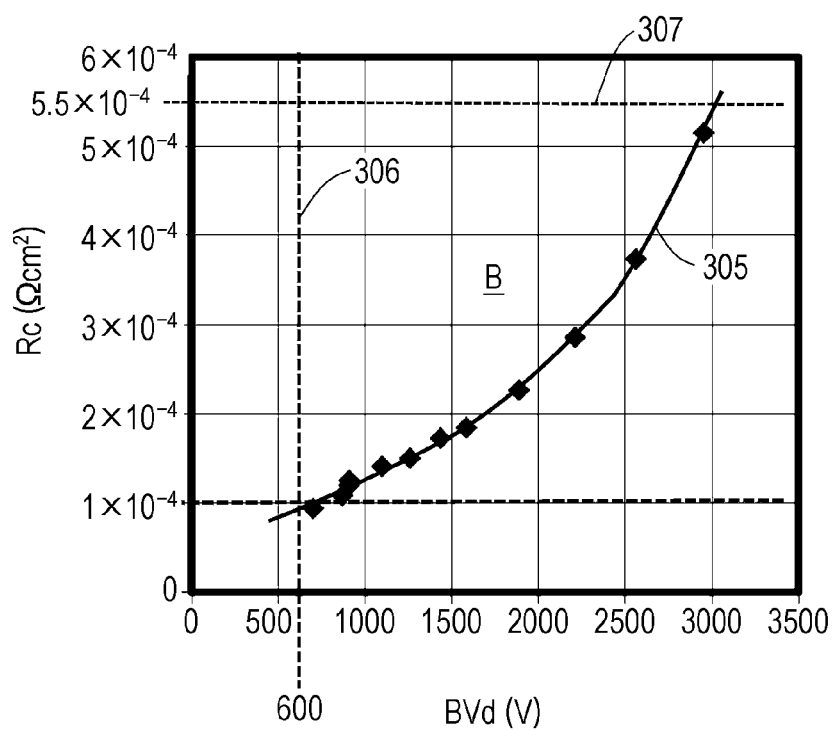
FIG. 5 is a diagram illustrating a relationship between the contact resistance Rc and the avalanche breakdown voltage BVd of semiconductor devices according to the first embodiment.

FIG. 5 is a diagram illustrating a relationship between the avalanche breakdown voltage BVd and the contact resistance Rc. The graph in FIG. 5 is based on the same calculation results as FIG. 4.

In FIG. 5, the region B on and in the upper left of the line 305 satisfies the relation (15). As mentioned earlier, unipolar devices including silicon carbide are mainly expected to be used with a breakdown voltage of 600 V or above. In light of this demand, the contact resistance Rc may be $1 \times 10^{-4}$ Ωcm$^2$ or above. To attain a breakdown voltage of about 3000 V, the contact resistance Rc may be $5.5 \times 10^{-4}$ Ωcm$^2$ or less. Thus, the contact resistance Rc and the avalanche breakdown voltage may be set to fall in the region B enclosed by the line 305, the line 306 and the line 307 in FIG. 5.

(Processes for Manufacturing Semiconductor Devices 1000)

A process for manufacturing a semiconductor device 1000 according to the present embodiment will be described with reference to FIGS. 6A to 9B. FIGS. 6A to 9B are sectional views illustrating some of the steps in the process for manufacturing a semiconductor device 1000.

First, a semiconductor substrate 101 is provided. For example, the semiconductor substrate 101 is a low-resistance n-type 4H—SiC offcut substrate having a resistivity of about 0.02 Ωcm.

Figure 6A:
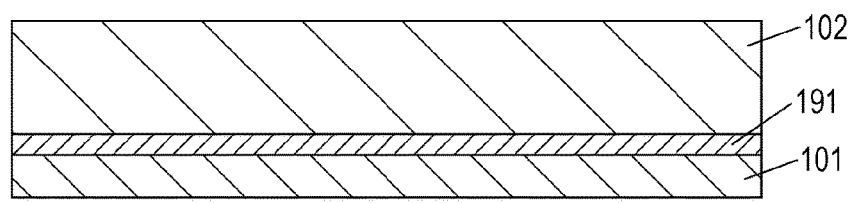
FIG. 6A is a schematic sectional view illustrating a step in an exemplary process for manufacturing a semiconductor device according to the first embodiment.

As illustrated in FIG. 6A, a high-resistance n-type drift layer 102 is epitaxially grown on the semiconductor substrate 101. Prior to the formation of the drift layer 102, an n-type SiC buffer layer 191 having a high impurity concentration may be deposited on the semiconductor substrate 101. The impurity concentration in the buffer layer 191 is, for example, $1 \times 10^{18}$ cm$^{-3}$, and the thickness of the buffer layer 191 is, for example, 0.5 µm. For example, the drift layer 102 is formed of n-type 4H—SiC. The impurity concentration and thickness of the drift layer 102 are, for example, $1.6 \times 10^{16}$ cm$^{-3}$ and 5 µm.

Figure 6B:
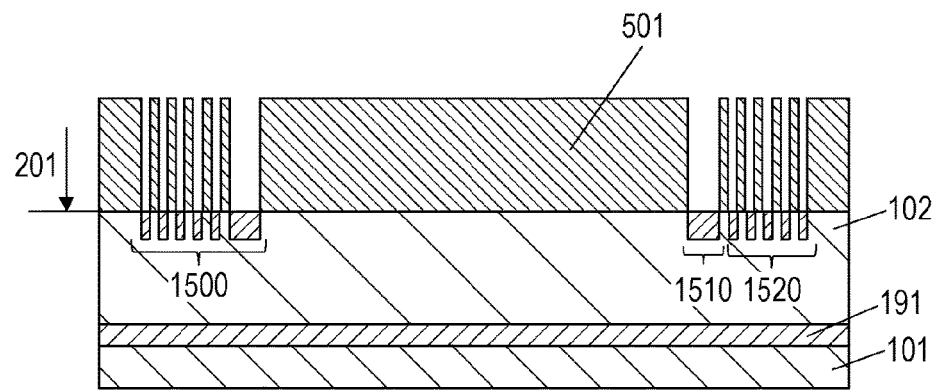
FIG. 6B is a schematic sectional view illustrating a step in an exemplary process for manufacturing a semiconductor device according to the first embodiment.

Next, as illustrated in FIG. 6B, a mask 501 made of, for example, SiO$_2$ is formed on the drift layer 102 and thereafter p-type impurity ions, for example, Al ions are implanted into the drift layer 102. Consequently, a termination implanted region 1500 including a guard ring implanted region 1510 and FLR implanted regions 1520 is formed in the drift layer 102. The termination implanted region 1500, the guard ring implanted region 1510 and the FLR implanted regions 1520 will define a termination region 150, a guard ring region 151 and FLR regions 152, respectively, later in the process. The implantation doses in the termination implanted region 1500, the guard ring implanted region 1510 and the FLR implanted regions 1520 are all $4.6 \times 10^{15}$ cm$^{-2}$. During the impurity implantation, the semiconductor substrate 101 may be heated at, for example, a temperature of 300° C. to 500° C. The impurity implantation energy is controlled so that the junction depth to the pn junction formed between the termination region 150 and the drift layer 102 will be, for example, about 1 µm from a surface 201 of the drift layer 102. After the impurity implantation, the mask 501 is removed.

Figure 7A:
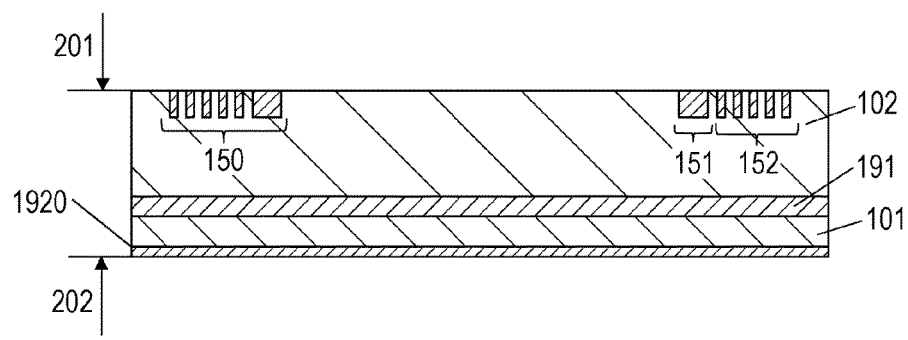
FIG. 7A is a schematic sectional view illustrating a step in an exemplary process for manufacturing a semiconductor device according to the first embodiment.

Next, as illustrated in FIG. 7A, ions, for example, N ions are implanted into a second principal surface 202 of the semiconductor substrate 101 to form a backside implanted region 1920 which will form a contact resistance adjustment region 192 later in the process. The implantation dose in the backside implanted region 1920 is $1 \times 10^{15}$ cm$^{-2}$. During the impurity implantation, the semiconductor substrate 101 may be heated at, for example, a temperature of room temperature to 500° C. This impurity implantation is used to control the contact resistance between the semiconductor substrate 101 and a second electrode 110 as will be described later. Thus, this impurity implantation step may be omitted or may involve any first conductivity type (here, n-type) impurity other than N. The impurity that is implanted may be of second conductivity type (here, p-type) or may be ions of other substance such as inert gas or metal, or the contact resistance adjustment region 192 may be finally converted to the first conductivity type. The impurity implantation may be performed without heating the semiconductor substrate 101. Instead of the impurity implantation step, the second principal surface 202 of the semiconductor substrate 101 may be modified by roughening or the like. The formation of the backside implanted region 1920 or the surface modification on the second principal surface 202 of the semiconductor substrate 101 is performed under such conditions that an ohmic junction will be formed between the semiconductor substrate 101 and the second electrode 110.

Next, heat treatment is performed at a temperature of 1500° C. to 1900° C. to convert the termination implanted region 1500, the guard ring implanted region 1510, the FLR implanted regions 1520 and the backside implanted region 1920 into a termination region 150, a guard ring region 151, FLR regions 152 and a contact resistance adjustment region 192, respectively. In an embodiment, a carbon film may be deposited on the surface of the drift layer 102 before the heat treatment and may be removed after the heat treatment. It is needless to mention that a carbon film may be deposited similarly on the second principal surface 202 of the semiconductor substrate 101 and may be removed after the heat treatment. Further, thermal oxide films may be formed on the surface 201 of the drift layer 102 and the second principal surface 202 of the semiconductor substrate 101 after the removal of the carbon films, and the thermal oxide films may be removed by etching to clean the surface 201 of the drift layer 102 and the second principal surface 202 of the semiconductor substrate 101.

Figure 7B:
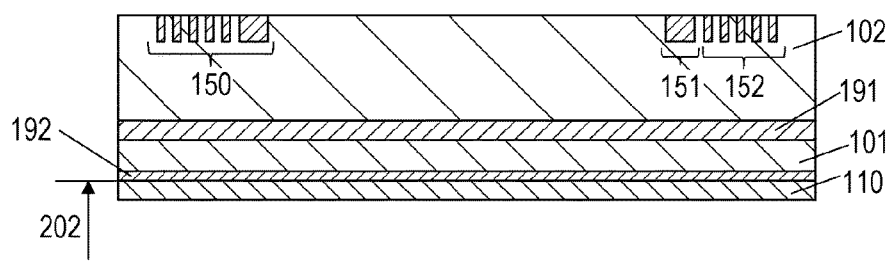
FIG. 7B is a schematic sectional view illustrating a step in an exemplary process for manufacturing a semiconductor device according to the first embodiment.

Next, as illustrated in FIG. 7B, a second electrode 110 is formed on the second principal surface 202 of the semiconductor substrate 101 by, for example, depositing titanium (Ti) in a thickness of about 100 to 200 nm and heat treating the Ti film at 800° C. to 1050° C. The second electrode 110 forms an ohmic junction with the second principal surface 202 of the semiconductor substrate 101. By the presence of the contact resistance adjustment region 192, the contact resistance at room temperature is controlled to $1 \times 10^{-4}$ $\Omega cm^2$ or above. While the present embodiment illustrates the electrode material as being Ti, other metal may be selected as long as the material includes a metal which can form silicide or carbide by reacting with the semiconductor substrate 101. The heat treatment temperature may be selected appropriately in accordance with the metal material that is selected. As long as a desired contact resistance can be obtained, the heat treatment temperature may be, for example, room temperature to 800° C.

Figure 8A:
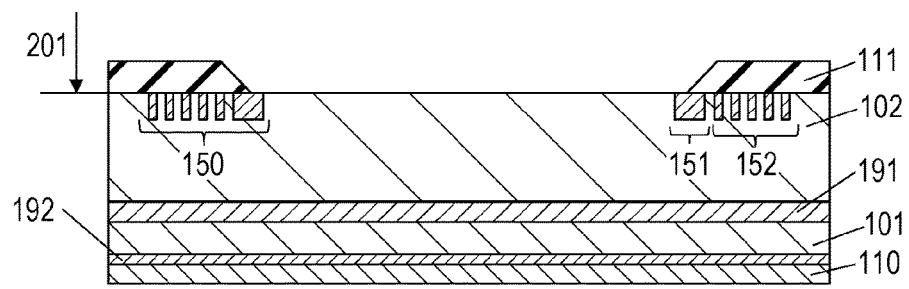
FIG. 8A is a schematic sectional view illustrating a step in an exemplary process for manufacturing a semiconductor device according to the first embodiment.

Next, an insulating film made of, for example, $SiO_2$ is formed on the surface of the drift layer 102. For example, the thickness of the insulating film is 300 nm. Next, a photoresist mask is formed and the insulating film is treated by, for example, wet etching so as to expose a portion of the guard ring region 151, and the portion of the drift layer 102 enclosed by the guard ring region 151. Thereafter, the mask is removed. In this manner, as illustrated in FIG. 8A, a perforated insulating film 111 is obtained.

Figure 8B:
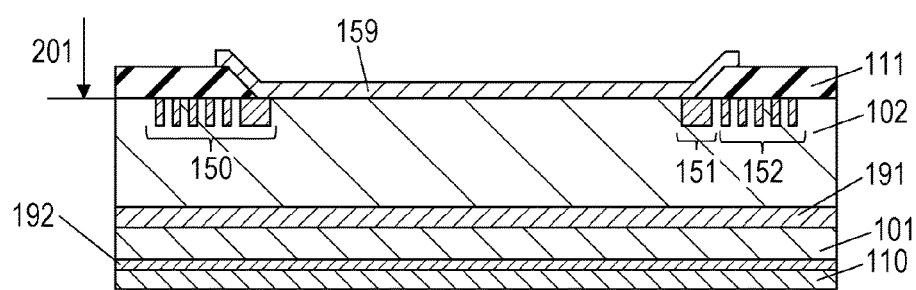
FIG. 8B is a schematic sectional view illustrating a step in an exemplary process for manufacturing a semiconductor device according to the first embodiment.

Next, a conductive film for first electrode is deposited so as to cover the entire surface of the perforated insulating film 111 and the drift layer 102 exposed in the opening. The conductive film for first electrode is, for example, a film including a metal such as Ti, Ni or Mo. For example, the thickness of the conductive film for first electrode is 200 nm. After the deposition, a photoresist mask is formed, and the conductive film for first electrode is patterned so that the patterned film will cover at least the drift layer 102 exposed from the insulating film 111. Consequently, as illustrated in FIG. 8B, a first electrode 159 is formed. In the example illustrated in FIG. 8B, the periphery of the first electrode 159 is located on the insulating film 111. The first electrode 159 is in contact with the portion of the drift layer 102 and the portion of the guard ring region 151 exposed from the insulating film 111. Subsequently, the semiconductor substrate 101 having the first electrode 159 is heat treated at a temperature of 100° C. to 700° C. to form a Schottky junction between the first electrode 159 and the drift layer 102.

Next, a conductive film for surface electrode is deposited on the first electrode 159 and the insulating film 111. For example, the conductive film for surface electrode is a metal film including Al and having a thickness of about 4 μm. A mask is formed on the conductive film for surface electrode, and a portion of the insulating film 111 is exposed by etching the undesired portion of the conductive film. When the conductive film for surface electrode is treated by wet etching, the conditions of the etching of the conductive film may be controlled so that the first electrode 159 will not be exposed. After the undesired portion of the conductive film for surface electrode is removed by etching, the mask is removed. Consequently, a surface electrode 112 illustrated in FIG. 9A is formed.

Figure 9A:
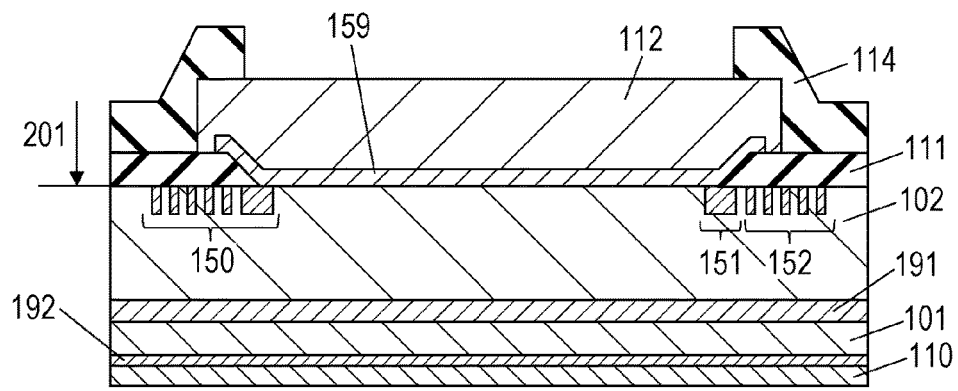
FIG. 9A is a schematic sectional view illustrating a step in an exemplary process for manufacturing a semiconductor device according to the first embodiment.

Next, a passivation film 114 illustrated in FIG. 9A is formed as required. First, a passivation film 114 made of, for example, SiN is formed on the exposed insulating film 111 and the surface electrode 112. Thereafter, a mask is provided which has an opening that exposes a portion of the passivation film 114 located above the surface electrode 112, and the portion of the passivation film is removed by, for example, dry etching to expose the corresponding portion of the surface electrode 112. Thereafter, the mask is removed. In this manner, as illustrated in FIG. 9A, an opening is formed in the passivation film 114 through which the portion of the surface electrode 112 is exposed. The passivation film 114 may be any insulator, and may be, for example, a $SiO_2$ film or an organic film such as a polyimide film.

Figure 9B:
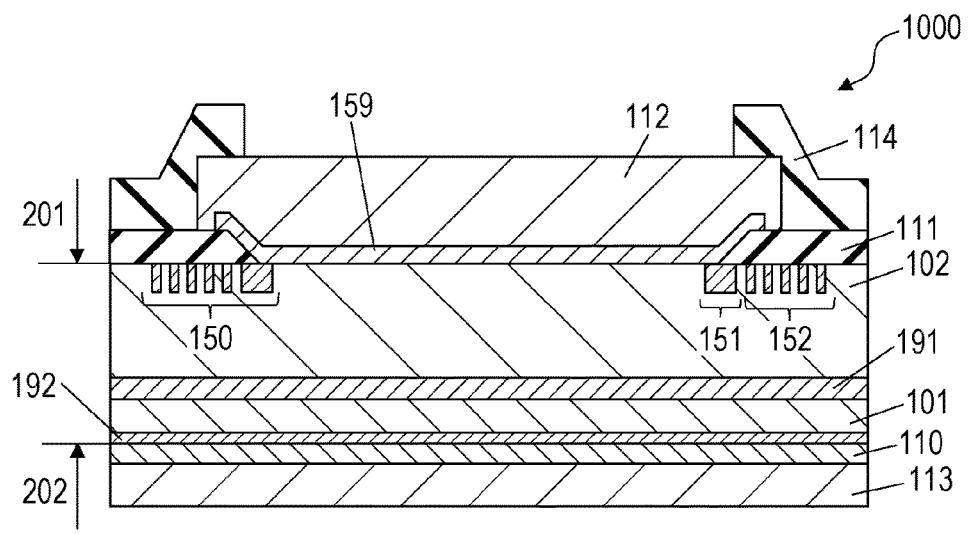
FIG. 9B is a schematic sectional view illustrating a step in an exemplary process for manufacturing a semiconductor device according to the first embodiment.

Next, as illustrated in FIG. 9B, a backside electrode 113 is formed as required. The backside electrode 113 may be formed before the formation of the passivation film 114, or before the formation of the surface electrode 112. For example, the backside electrode 113 may be formed by depositing Ti, Ni and Ag in this order onto the second electrode 110. The thicknesses of the Ti, Ni and Ag are, for example, 0.1 μm, 0.3 μm and 0.7 μm, respectively. A semiconductor device 1000 is manufactured through the steps described above.

EXAMPLE

Figure 10:
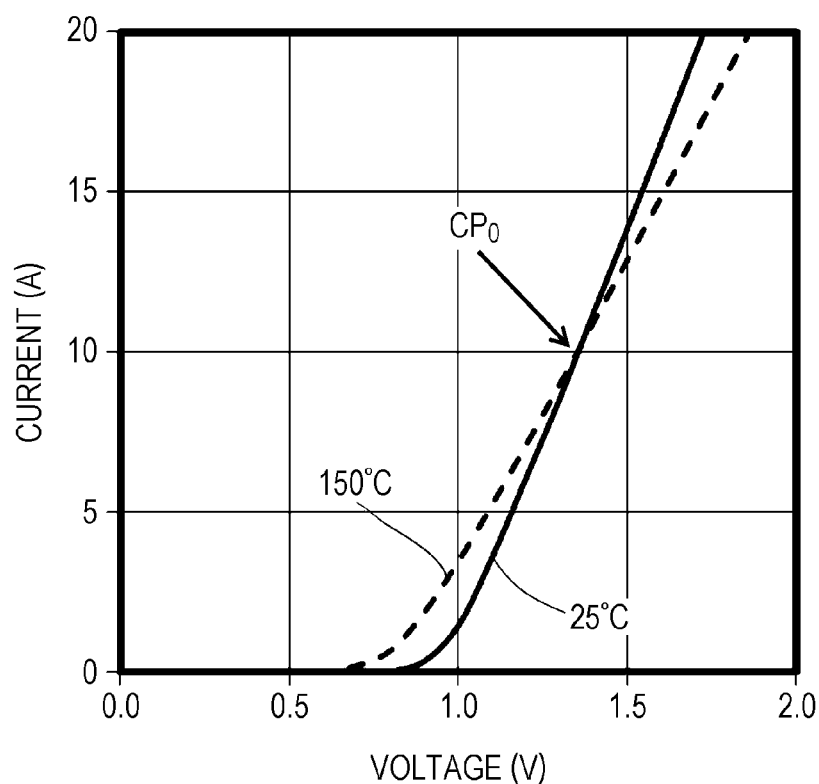
FIG. 10 is a diagram illustrating current-voltage characteristics of a semiconductor device obtained in Example.

FIG. 10 is a diagram illustrating an example of the forward current-voltage characteristics of a semiconductor device obtained in Example. The characteristics at room temperature (25° C.) and at 150° C. are indicated with an actual line and a broken line, respectively.

The semiconductor device of Example is an approximately 2 mm×2 mm square chip having an avalanche breakdown voltage at room temperature of not less than 800 V. As illustrated in FIG. 10, the semiconductor device of Example has a forward current at room temperature of about 10 A at a voltage of 1.35 V, and about 14 A at a voltage of 1.5 V.

For comparison, a plurality of semiconductor devices representing Comparative Example were provided which were silicon carbide Schottky barrier diodes satisfying the similar specifications. The rated voltage of the comparative semiconductor devices was about 600 V or about 650 V, and the rated current was about 10 A.

The characteristics of the semiconductor devices of Example and Comparative Example were compared. The results will be discussed below.

In the semiconductor devices of Comparative Example, the values of current at the cross point were generally 3 A to 4 A, while the values of current at the cross point in the semiconductor devices of Example were generally about 10 A. Thus, as described hereinabove with reference to FIG. 3, it was shown that the cross points of the semiconductor devices of Example shifted toward the higher forward voltage side and the higher forward current side as compared to the cross points of the semiconductor devices of Comparative Example.

Next, the semiconductor devices of Example were studied to determine the temperature dependence of differential resistance dRf.

First, from the characteristics shown in FIG. 10, the differential resistances of the semiconductor device of Example at 25° C. and 150° C. were calculated. The current-voltage characteristics of the semiconductor device of Example were not line graphs in contrast to those shown in FIG. 2 and FIG. 3; as illustrated in FIG. 10, the forward current increased with a smooth curve as the forward voltage increased and finally the increase became substantially linear. Here, the region from 5 A current to 15 A current was linearly approximated, and the differential resistances at 25° C. and 150° C., $dRf_{25}$ and $dRf_{150}$, were determined. Similarly, the differential resistances dRf at 75° C., 125° C. and 175° C. were calculated from the current-voltage characteristics. The results are illustrated in FIG. 11.

Figure 11:
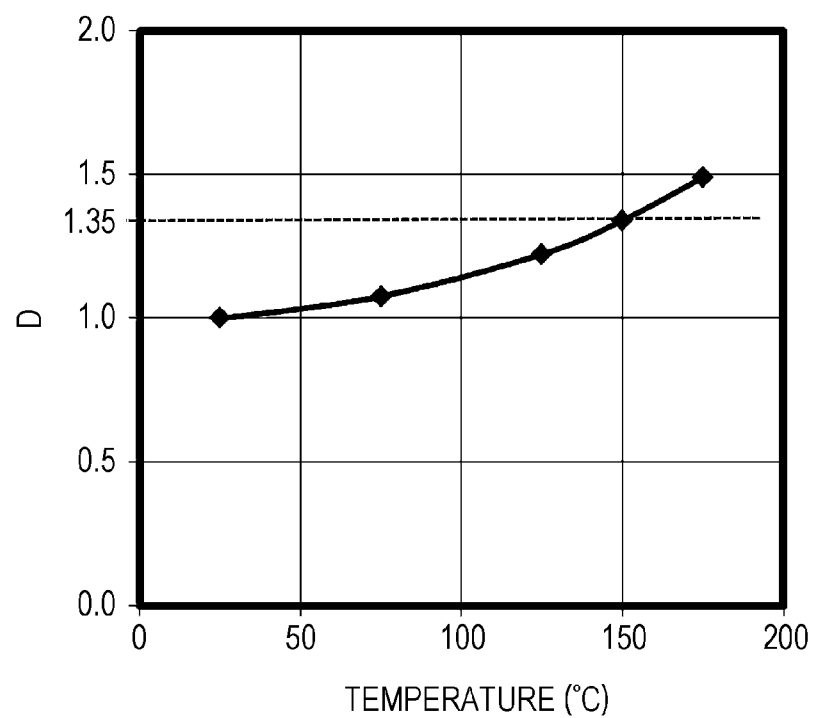
FIG. 11 is a diagram illustrating a temperature dependence of the differential resistance of a semiconductor device obtained in Example.

FIG. 11 is a diagram illustrating the temperature dependence of the differential resistance dRf of the semiconductor device of Example. The abscissa is the temperature, and the ordinate is the differential resistance ratio D. As described in the relation (8), the differential resistance ratio D is a value obtained by normalizing the differential resistance at the temperature with the differential resistance at 25° C., $dRf_{25}$. In this example, the differential resistance ratio at 150° C., $D_{150}$, was:

$$D_{150}=dRf_{150}/dRf_{25}=1.35.$$

In the semiconductor devices of Comparative Example, the region of the current-voltage characteristics at currents which were 0.5 times to 1.5 times greater than the rated current was linearly approximated, and the differential resistance ratio at 150° C., $D_{150}$, was calculated. As a result, the values of $D_{150}$ were larger than 1.5. This result showed that the semiconductor devices of Example had a small change in differential resistance by temperature variation as compared to the semiconductor devices of Comparative Example which represented commercial products. The reason for this result is probably because the semiconductor devices of Example have a higher contact resistance Rc than the semiconductor devices of Comparative Example and the decrease in contact resistance Rc at an elevated temperature compensates for the increase in the on-state resistance of the semiconductor devices by temperature rise.

The semiconductor devices of Example which differed from one another in the concentration of the drift layer and the area of current-flowing portions were compared to one another. The comparison estimated the contact resistance Rc of the semiconductor devices at room temperature to be $3\times10^{-4}$ $\Omega cm^2$. Further, based on the results of experiments performed by the present inventor, the contact resistance Rc at 150° C. was estimated to be at least 50%-90% smaller than the contact resistance Rc at room temperature. By finer control of the contact resistance Rc, the change in differential resistance by temperature variation can be further reduced.

For example, the differential resistance ratio at 150° C., $D_{150}$, can be reduced to less than 1.5 by controlling the contact resistance Rc. It is also possible to reduce the differential resistance ratio at 150° C., $D_{150}$, to 1.35 or less by controlling the contact resistance Rc. Because $dRf_{150}>dRf_{25}$ in Example, the differential resistance ratio $D_{150}$ is greater than 1. Thus, $D_{150}$ may satisfy $1<D_{150}<1.5$. $D_{150}$ may satisfy $1<D_{150}\leq1.35$. With this configuration, the change in differential resistance by temperature variation can be reduced as compared to the conventional devices.

It is also possible to calculate the contact resistance Rc of the semiconductor device at room temperature by subtracting the substrate resistance Rsub, the drift resistance Rd and the buffer layer resistance Rb from the on-state resistance of the semiconductor device. The on-state resistance (differential resistance dRf) may be determined from the current-voltage characteristics. The substrate resistance Rsub, the drift resistance Rd and the buffer layer resistance Rb may be calculated from properties such as the impurity concentrations and thicknesses of the semiconductor substrate, the drift layer and the buffer layer.

Figure 12:
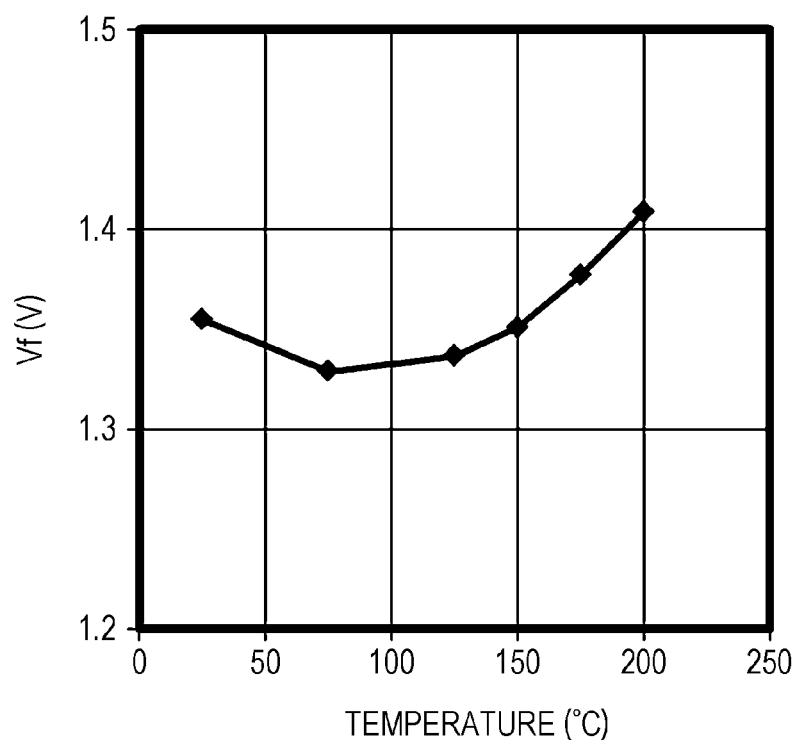
FIG. 12 is a diagram illustrating a temperature dependence of the forward voltage Vf of a semiconductor device obtained in Example when biased at a forward current of 10 A.

FIG. 12 is a diagram illustrating the temperature dependence of the forward voltage Vf of the semiconductor device of Example at a forward current of 10 A.

In general, the forward voltage Vf of an SBD is increased with increasing temperature. In contrast, the forward voltage Vf of the semiconductor device of Example is substantially constant in the range of temperatures from room temperature to 150° C. and increases with increasing temperature after 150° C. This result shows that the control of the contact resistance Rc makes it possible to realize substantially constant forward voltage Vf between room temperature and 150° C. In other words, it has been shown that the change in the on-state resistance of the semiconductor device by temperature variation can be reduced.

While Example discussed above has illustrated the semiconductor devices as having an avalanche breakdown voltage at room temperature of not less than 800 V, the avalanche breakdown voltage of the semiconductor devices of the present embodiment is not limited thereto. For example, the semiconductor devices of the present embodiment may have an avalanche breakdown voltage of 600 V to 3000 V, a range in which unipolar devices can be used. Because the change in differential resistance can be reduced more effectively as the ratio of the contact resistance to the drift resistance at room temperature is higher, the present embodiment may be applied to semiconductor devices having a relatively low drift resistance and an avalanche breakdown voltage of 1200 V or less.

Modified Example

Hereinbelow, a modified example of the semiconductor devices of the present embodiment will be described.

Figure 13:
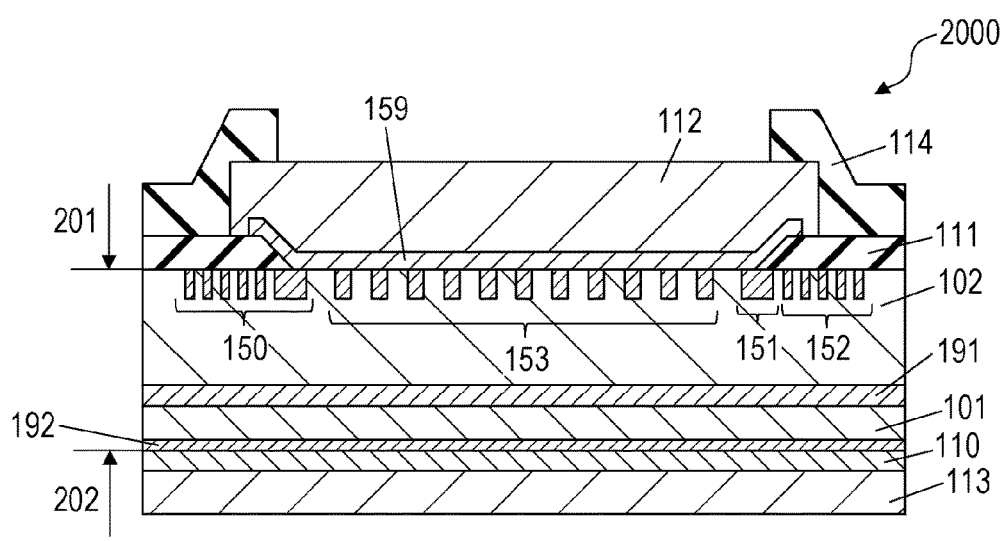
FIG. 13 is a schematic sectional view illustrating a semiconductor device according to Modified Example of the first embodiment.

FIG. 13 is a sectional view illustrating a semiconductor device 2000 according to Modified Example of the first embodiment.

The semiconductor device 2000 has a so-called JBS structure including second conductivity type barrier regions 153. The barrier regions 153 may be formed at the same time as the termination region 150, the guard ring region 151 and the FLR regions 152. To ensure that a forward current will not be blocked between the adjacent barrier regions 153, the concentration of the drift layer 102 between the adjacent barrier regions 153 may be equal to or higher than the concentration of the drift layer 102 below the barrier regions.

Because of having the barrier regions 153 in the drift layer 102, the semiconductor device 2000 has a higher differential resistance dRf than the semiconductor device 1000 illustrated in FIG. 1. However, the temperature dependence of differential resistance dRf shows a similar tendency as that in the semiconductor device 1000, and the change in differential resistance dRf by temperature variation can be reduced by controlling the contact resistance Rc. For example, $dRf_{150}/dRf_{25}$ can be reduced to less than 1.5 by controlling the contact resistance Rc. Further, $dRf_{150}/dRf_{25}$ may be reduced to 1.35 or less by controlling the contact resistance Rc.

The configurations of the semiconductor devices of the present disclosure, and the materials of the components are not limited to those described hereinabove. For example, the materials of the first electrode 159 are not limited to Ti, Ni and Mo described hereinabove. The first electrode 159 may be formed of a material selected from the group consisting of other metals capable of forming a Schottky junction with the drift layer 102, and alloys and compounds of such metals.

In an embodiment, a barrier film including, for example, TiN may be formed between the first electrode 159 and the surface electrode 112. The thickness of the barrier film is, for example, 50 nm.

While the embodiments of the present disclosure have illustrated the semiconductor substrate as having a thickness of 350 μm, the thickness is not limited thereto. The temperature dependence of the characteristics of semiconductor devices is mainly dominated by the drift resistance. Because the change in the resistance of the semiconductor substrate by temperature is small as compared to that in the drift resistance, the thickness of the semiconductor substrate may be reduced.

While the embodiments of the present disclosure have illustrated the silicon carbide as being 4H—SiC, the silicon carbide may be other polytype such as 6H—SiC, 3C—SiC or 15R—SiC. Further, while the embodiments of the present disclosure have illustrated the first principal surface of the SiC substrate as being offcut relative to (0001) plane, the first principal surface of the SiC substrate may be (11-20) plane, (1-100) plane, (000-1) plane or a plane with an offcut relative to any of these planes. Further, the semiconductor substrate 101 may be a Si substrate. A 3C—SiC drift layer may be formed on the Si substrate. In this case, annealing may be performed at a temperature below the melting point of the Si substrate to activate impurity ions implanted in the 3C—SiC drift layer.

While the embodiments discussed above have illustrated the semiconductor devices as being SBDs, the semiconductor devices of the present disclosure are not limited thereto and may be, for example, MISFETs.

What is claimed is:

1. A semiconductor device, comprising:
   a semiconductor substrate of a first conductivity type, having a first principal surface and a second principal surface opposite to the first principal surface;
   a silicon carbide semiconductor layer of the first conductivity type, disposed on the first principal surface of the semiconductor substrate;
   a termination region of a second conductivity type, disposed within the silicon carbide semiconductor layer;
   a first electrode disposed on the silicon carbide semiconductor layer; and
   a second electrode disposed on the second principal surface of the semiconductor substrate and forming an ohmic junction with the semiconductor substrate, wherein:
   the semiconductor device satisfies 0.13 Rc/Rd, where Rc is a contact resistance between the second principal surface of the semiconductor substrate and the second electrode at 25° C. and Rd is a resistance of the silicon carbide semiconductor layer in a direction normal to the first principal surface at 25° C.,
   the contact resistance Rc is not less than $1\times10^{-4}$ $\Omega m^2$,
   the termination region includes a guard ring region and an electrically floating region enclosing the guard ring region in the plan view;
   the first electrode includes a first part and two second parts surrounding the first part in a cross sectional view,
   the first part is directly contacts with the silicon carbide semiconductor layer without contacting the terminal region,
   each of the two second parts includes:
      a first portion directly in contact with the guard ring region,
      a second portion separated from the silicon carbide semiconductor layer by an insulating film, and
      an inclined portion extending from the first portion to the second portion along an edge of the insulating film at an angle less than a right angle.

2. The semiconductor device according to claim 1, wherein:
   the termination region encloses a portion of a surface of the silicon carbide semiconductor layer in a plan view.

3. The semiconductor device according to claim 2, wherein
   the electrically floating region being out of contact with the guard ring region and enclosing the guard ring region in the plan view.

4. The semiconductor device according to claim 1, wherein:
   the contact resistance Rc is not more than $3\times10^{-4}$ $\Omega cm^2$, and
   the semiconductor device satisfies 0.15≤Rc/Rd.

5. The semiconductor device according to claim 1, wherein the semiconductor device satisfies Rc/Rd≤0.65.

6. The semiconductor device according to claim 1, wherein the contact resistance Rc is not more than $5.5\times10^{-4}$ $\Omega cm^2$.

7. The semiconductor device according to claim 1, wherein:
   the semiconductor device is a diode, and
   an avalanche breakdown voltage of the diode at 25° C. is not less than 600 V and not more than 3000 V.

8. The semiconductor device according to claim 1, further comprising:
   a contact resistance adjustment region disposed within the semiconductor substrate in contact with the second principal surface.

9. The semiconductor device according to claim 8, wherein the contact resistance adjustment region is of the first conductivity type.

10. The semiconductor device according to claim 8, wherein the contact resistance adjustment region is an implanted region.

11. The semiconductor device according to claim 8, wherein the second principal surface is modified by roughening.

12. The semiconductor device according to claim 1, wherein the second electrode includes titanium.

13. The semiconductor device according to claim 12, wherein a thickness of the second electrode is not less than 100 nm and not more than 200 nm.

14. The semiconductor device according to claim 1, wherein the first electrode forms a Schottky junction with the silicon carbide semiconductor layer.

15. A semiconductor device, comprising:
a semiconductor substrate of a first conductivity type, having a first principal surface and a second principal surface opposite to the first principal surface;
a silicon carbide semiconductor layer of the first conductivity type, disposed on the first principal surface of the semiconductor substrate;
a termination region of a second conductivity type, disposed within the silicon carbide semiconductor layer;
a first electrode disposed on the silicon carbide semiconductor layer; and
a second electrode disposed on the second principal surface of the semiconductor substrate and forming an ohmic junction with the semiconductor substrate, wherein:
the semiconductor device has nonlinear current-voltage characteristics when a voltage is applied between the first electrode and the second electrode to make the first electrode more positive than the second electrode,
the semiconductor device satisfies $1<dRf_{150}/dRf_{25}<1.5$, where $dRf_{25}$ is a ratio of a first voltage increase to a first current increase at 25° C. and $dRf_{150}$ is a ratio of a second voltage increase to a second current increase at 150° C. in an on-state region of the nonlinear current-voltage characteristics,
the termination region includes a guard ring region and an electrically floating region enclosing the guard ring region in the plan view;
the first electrode includes a first part and two second parts surrounding the first part in a cross sectional view,
the first part is directly contacts with the silicon carbide semiconductor layer without contacting the terminal region,
each of the two second parts includes:
a first portion directly in contact with the guard ring region,
a second portion separated from the silicon carbide semiconductor layer by an insulating film, and
an inclined portion extending from the first portion to the second portion along an edge of the insulating film at an angle less than a right angle.

16. The semiconductor device according to claim 15, wherein the semiconductor device satisfies $1<dRf_{150}/dRf_{25}\leq1.35$.

17. The semiconductor device according to claim 15, wherein:
the semiconductor device is a diode, and
an avalanche breakdown voltage of the diode at 25° C. is not less than 600 V and not more than 3000 V.

18. The semiconductor device according to claim 15, wherein the first electrode forms a Schottky junction with the silicon carbide semiconductor layer.

19. The semiconductor device according to claim 15, wherein a contact Rc between the second principal surface of the semiconductor substrate and the second electrode at 25° C. is not less than $1\times10^{-4}$ $\Omega cm^2$.

* * * * *